(12) United States Patent
Yamashita et al.

(10) Patent No.: US 9,570,544 B2
(45) Date of Patent: Feb. 14, 2017

(54) SEMICONDUCTOR DEVICE

(71) Applicant: Panasonic Intellectual Property Management Co., Ltd., Osaka (JP)

(72) Inventors: Katsushige Yamashita, Osaka (JP); Kenichi Nishimura, Toyama (JP); Atsuya Yamamoto, Toyama (JP); Shigetaka Aoki, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/975,825

(22) Filed: Dec. 20, 2015

(65) Prior Publication Data
US 2016/0104767 A1    Apr. 14, 2016

Related U.S. Application Data

(63) Continuation of application No. PCT/JP2014/003528, filed on Jul. 2, 2014.

(30) Foreign Application Priority Data

Jul. 16, 2013 (JP) ................................. 2013-147245

(51) Int. Cl.
H01L 29/66 (2006.01)
H01L 29/06 (2006.01)
(Continued)

(52) U.S. Cl.
CPC ....... *H01L 29/0623* (2013.01); *H01L 29/0821* (2013.01); *H01L 29/1095* (2013.01);
(Continued)

(58) Field of Classification Search
CPC ............. H01L 29/0623; H01L 29/0821; H01L 29/1095; H01L 29/41708; H01L 29/66128
See application file for complete search history.

(56) References Cited

U.S. PATENT DOCUMENTS

2006/0043417 A1    3/2006 Terashima
2007/0018195 A1    1/2007 Hartner et al.
(Continued)

FOREIGN PATENT DOCUMENTS

DE    102008046388    3/2010
JP    2-244634    9/1990
(Continued)

OTHER PUBLICATIONS

International Search Report of PCT application No. PCT/JP2014/003528 dated Aug. 5, 2014.
(Continued)

*Primary Examiner* — Bradley K Smith
(74) *Attorney, Agent, or Firm* — McDermott Will & Emery LLP

(57) ABSTRACT

A semiconductor device includes: a silicon substrate that includes a high-concentration layer containing first conductivity type impurities; a low-concentration layer formed on the high-concentration layer and containing first conductivity type impurities; a first electrode and a second electrode formed on the low-concentration layer; a vertical semiconductor element that allows current to flow between the second electrode and the high-concentration layer; and a first trench unit that realizes electric connection between the first electrode and the high-concentration layer. The first trench unit consists of first polysilicon containing first conductivity type impurities, and a diffusion layer configured to surround the first polysilicon in a plan view and to contain first conductivity type impurities. The first polysilicon is configured to reach the high-concentration layer by penetrating the low-concentration layer. Respective concentrations of the first conductivity type impurities contained in the first polysilicon and in the diffusion layer are kept constant in a
(Continued)

direction from the low-concentration layer to the high-concentration layer.

15 Claims, 14 Drawing Sheets

(51) Int. Cl.
    *H01L 29/417*     (2006.01)
    *H01L 29/732*     (2006.01)
    *H01L 29/861*     (2006.01)
    *H01L 29/872*     (2006.01)
    *H01L 29/08*     (2006.01)
    *H01L 29/40*     (2006.01)
    *H01L 29/78*     (2006.01)
    *H01L 29/10*     (2006.01)
    *H01L 29/735*     (2006.01)

(52) U.S. Cl.
    CPC ...... *H01L 29/407* (2013.01); *H01L 29/41708* (2013.01); *H01L 29/66128* (2013.01); *H01L 29/66143* (2013.01); *H01L 29/66272* (2013.01); *H01L 29/66734* (2013.01); *H01L 29/735* (2013.01); *H01L 29/7322* (2013.01); *H01L 29/7809* (2013.01); *H01L 29/7813* (2013.01); *H01L 29/7823* (2013.01); *H01L 29/8611* (2013.01); *H01L 29/8725* (2013.01)

(56) References Cited

U.S. PATENT DOCUMENTS

| | | |
|---|---|---|
| 2008/0083966 A1 | 4/2008 | Oonishi |
| 2008/0230833 A1 | 9/2008 | Zundel et al. |
| 2008/0265314 A1 | 10/2008 | Kobayashi |
| 2009/0166795 A1 | 7/2009 | Yoon |
| 2010/0230774 A1 | 9/2010 | Alter |
| 2011/0212595 A1* | 9/2011 | Hu .................. H01L 21/761 438/430 |
| 2011/0227187 A1 | 9/2011 | Oonishi |
| 2012/0007216 A1 | 1/2012 | Choy et al. |
| 2012/0289037 A1* | 11/2012 | Lin .................. H01L 29/7811 438/561 |
| 2013/0075746 A1* | 3/2013 | Mallikarjunaswamy H01L 29/735 257/75 |
| 2013/0153995 A1 | 6/2013 | Misawa et al. |

FOREIGN PATENT DOCUMENTS

| | | |
|---|---|---|
| JP | 4-269835 | 9/1992 |
| JP | 5-029603 | 2/1993 |
| JP | 5-166823 | 7/1993 |
| JP | 7-326742 | 12/1995 |
| JP | 2006-066788 | 3/2006 |
| JP | 2008-034572 | 2/2008 |
| JP | 2008-277365 | 11/2008 |
| JP | 2009-164584 | 7/2009 |
| JP | 2013-125827 | 6/2013 |

OTHER PUBLICATIONS

The Extended European Search Report dated Aug. 2, 2016 for the related European Patent Application No. 14826802.2.

* cited by examiner

SEMICONDUCTOR DEVICE

RELATED APPLICATIONS

This application is a Continuation of International Application No. PCT/JP2014/003528, filed on Jul. 2, 2014, which in turn claims priority from Japanese Patent Application No. 2013-147245, filed on Jul. 16, 2013, the contents of all of which are incorporated herein by reference in their entireties.

TECHNICAL FIELD

The present disclosure relates to a semiconductor device including a vertical semiconductor element.

BACKGROUND

With demands for size reduction and power consumption reduction of electronic apparatuses in recent years, demands for size reduction and power consumption reduction of semiconductor devices included in electronic apparatuses are also increasing. For meeting these demands, semiconductor devices such as power MOS (Metal Oxide Semiconductor) transistors, which are used, for example, in DC-DC converters of electronic apparatuses, need size reduction by adoption of flip-chip structure, and ON-resistance reduction.

This type of semiconductor device generally includes electrodes disposed on a rear surface of a silicon substrate. In the case of the flip-chip structure, however, the rear-surface electrodes need to be disposed on a front surface of the silicon substrate. This structure requires electric connection between a high-concentration layer of the silicon substrate and the front-surface electrodes, and thus produces additional resistance in this electric connecting portion. Accordingly, it is necessary to reduce the resistance of this electric connecting portion.

For example, a manufacturing process of a semiconductor device disclosed in Unexamined Japanese Patent Publication No. 5-29603 for meeting this necessity includes: a step of forming an element separation trench and a substrate contact trench in an SOI (Silicon on Insulator) layer formed on a front surface of a substrate via an insulation film; a step of forming an insulation film within the element separation trench; a step of exposing the substrate through a bottom portion within the substrate contact trench; a step of implanting tungsten in a portion within the substrate contact trench by selective gas phase growth; a step of simultaneously implanting non-doped polysilicon in a remaining portion within the substrate contact trench and within the element separation trench; a step of forming a doped polysilicon film on polysilicon within the substrate contact trench; a step of executing heat treatment for the substrate; and a step of forming substrate electrodes on the doped polysilicon film. These steps realize an electric connection between a support substrate and substrate electrodes by using the tungsten within the substrate contact trench, the non-doped polysilicon containing impurities diffused by the heat treatment, and the SOI layer containing impurities diffused by the heat treatment.

SUMMARY

A semiconductor device according to the present disclosure includes: a silicon substrate including a high-concentration layer containing first conductivity type impurities; a low-concentration layer formed on the high-concentration layer and containing first conductivity type impurities at a concentration lower than a concentration of the high-concentration layer; a first electrode and a second electrode formed on the low-concentration layer; a vertical semiconductor element that allows current to flow between the second electrode and the high-concentration layer; and a first trench unit that realizes electric connection between the first electrode and the high-concentration layer. The first trench unit consists of first polysilicon containing first conductivity type impurities, and a diffusion layer configured to surround the first polysilicon in a plan view and to contain first conductivity type impurities. The first polysilicon is configured to reach the high-concentration layer from an upper surface of the low-concentration layer by penetrating the low-concentration layer. Respective concentrations of the first conductivity type impurities contained in the first polysilicon and in the diffusion layer are kept constant in a direction from the low-concentration layer to the high-concentration layer.

According to this structure, low resistance of electric connection is realized between the first electrode and the high-concentration layer.

The semiconductor device according to the present disclosure realizes a low resistance structure, thereby achieving size reduction and power consumption reduction of electronic apparatuses.

DESCRIPTION OF EMBODIMENTS

According to a semiconductor device disclosed in Unexamined Japanese Patent Publication No. 5-29603, the electric connection of the support substrate and the substrate electrodes is achieved by implanting the non-doped polysilicon into the substrate contact trench, and diffusing impurities by the heat treatment from the doped polysilicon film formed on the front surface into the non-doped polysilicon and the SOI layer. However, this structure may cause a problem of resistance increase by concentration decrease in a depth direction.

The present disclosure has been proposed in consideration of the aforementioned conventional problems. Provided according to the present disclosure is a low resistance semiconductor device capable of realizing low resistance in electric connection between front surface electrodes and a silicon substrate. This is realized by forming a combined structure constituted by polysilicon formed within a trench and containing impurities, and an impurity diffusion layer surrounding the polysilicon. And the structure extending from a front surface of the semiconductor device and reaching the substrate in such a state that respective impurity concentrations of the polysilicon and the diffusion layer become constant between the front surface and the substrate.

A semiconductor device according to the present disclosure is hereinafter described with reference to the drawings. In the following description, some details may not be particularly touched upon. For example, detailed explanation of well-known matters, or repeated explanation of substantially identical configurations may not be given. These omissions are made for avoiding unnecessary redundancy of the following description, and helping easy understanding of the present disclosure by those skilled in the art.

The accompanying drawings and the following description are presented not for the purpose of setting any limitations to subject matters defined in the appended claims, but only for the purpose of helping those skilled in the art fully understand the present disclosure.

First Exemplary Embodiment

A semiconductor device according to a first exemplary embodiment is hereinafter described with reference to FIGS. 1 through 6. Discussed in this exemplary embodiment is an N-channel type vertical gate semiconductor device embodying the present disclosure. According to this exemplary embodiment, a first conductivity type corresponds to N-type, while a second conductivity type corresponds to P type. The following description is applicable to a P-channel type vertical gate semiconductor device as well when conductivity types of respective impurity areas within the element are reversed.

Figure 1:
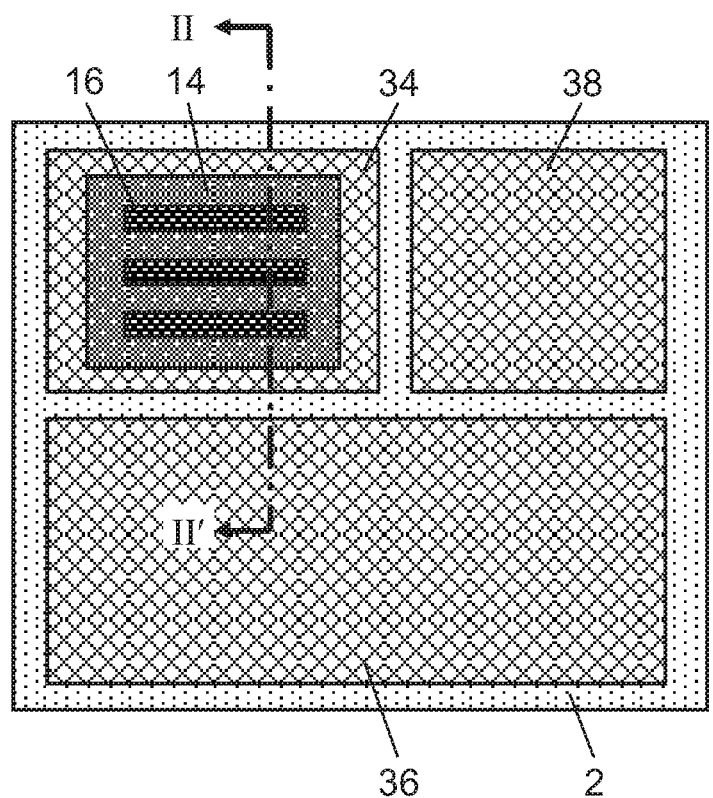
FIG. 1 is a plan view illustrating a configuration of a semiconductor device according to a first exemplary embodiment.
Figure 2:
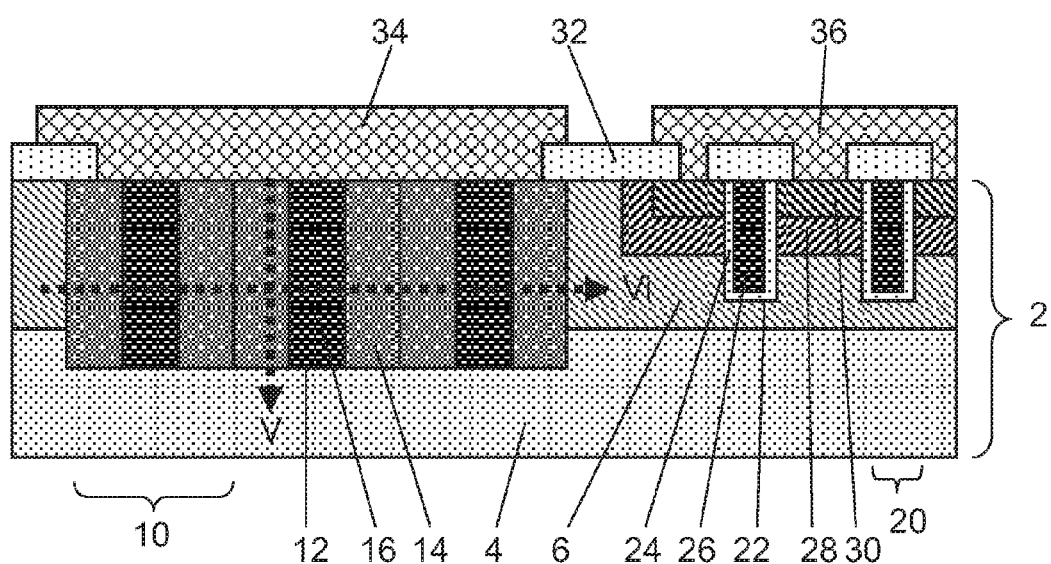
FIG. 2 is a cross-sectional view taken along line II-II' in FIG. 1.

FIG. 1 is a plan view illustrating a vertical gate semiconductor device according to the present disclosure. FIG. 2 is a cross-sectional view illustrating the vertical gate semiconductor device according to the present disclosure, taken along line II-IF in the plan view of FIG. 1. In FIG. 1, only positions of first polysilicon 16 and first conductivity type impurity diffusion layer 14 in plain view are shown for illustrative purpose.

As illustrated in FIGS. 1 and 2, the vertical gate semiconductor device according to this exemplary embodiment includes a drain electrode corresponding to first electrode 34, a source electrode corresponding to second electrode 36, and a gate electrode corresponding to third electrode 38, all of which electrodes 34, 36, and 38 are formed on a front surface of silicon substrate 2. Electrode pads may be connected with the respective electrodes. N-type first conductivity type impurity diffusion layer 14, and N-type-doped first polysilicon 16 are formed under first electrode 34.

Silicon substrate 2 of the vertical gate semiconductor device according to this exemplary embodiment includes N-type first conductivity type impurity low-concentration layer 6 disposed on N-type first conductivity type impurity high-concentration layer 4. Each of first trenches 12 formed under the drain electrode corresponding to first electrode 34 extends from a front surface of N-type first conductivity type impurity low-concentration layer 6 toward N-type first conductivity type impurity high-concentration layer 4. N-type-doped first polysilicon 16 formed within first trench 12, and first conductivity type impurity diffusion layer 14 surrounding first polysilicon 16 constitute each of first trench units 10.

Body area 28 is constituted by a P-type impurity area having a higher concentration than a concentration of N-type first conductivity type impurity low-concentration layer 6. Body area 28 provided on N-type first conductivity type impurity low-concentration layer 6 is located at a position shallower than the position of N-type first conductivity type impurity low-concentration layer 6. Source area 30 is constituted by an N-type impurity area having a higher concentration than the concentration of body area 28. Source area 30 provided on body area 28 is located at a position shallower than the position of body area 28. Silicon substrate 2 is constituted by N-type first conductivity type impurity high-concentration layer 4, N-type first conductivity type impurity low-concentration layer 6, body area 28, and source area 30. Each of second trenches 22 of silicon substrate 2 reaches N-type first conductivity type impurity low-concentration layer 6 from the front surface of silicon substrate 2, penetrating body area 28. Gate insulation film 24 is formed on an inner surface of each of second trenches 22. N-type-doped second polysilicon 26 is implanted into each of second trenches 22 via gate insulation film 24.

Interlayer insulation film 32 is formed on the front surface of silicon substrate 2. A contact formed on each of first trench units 10 is connected with the drain electrode corresponding to first electrode 34. A contact formed on source area 30 is connected with the source electrode corresponding to second electrode 36. Second polysilicon is connected with the gate electrode corresponding to third electrode 38. These connections constitute the vertical gate semiconductor device.

According to this exemplary embodiment, connection between the second polysilicon located in an outer peripheral portion of silicon substrate 2 and the gate electrode corresponding to third electrode 38 is not discussed. In addition, according to this exemplary embodiment, connection between body area 28 located in an area other than source area 30 and the source electrode corresponding to second electrode 36 is not discussed.

Positive voltage with respect to the source electrode corresponding to second electrode 36 is applied to the drain electrode corresponding to first electrode 34, while positive voltage with respect to the source electrode corresponding to second electrode 36 is applied to the gate electrode corresponding to third electrode 38. As a result, current flows from the drain electrode corresponding to first electrode 34, through first trench unit 10, first conductivity type impurity high-concentration layer 4, first conductivity type impurity low-concentration layer 6, body area 28, and source area 30, toward the source electrode corresponding to second electrode 36.

Low resistance of electric connection between the drain electrode corresponding to first electrode 34 and N-type first conductivity type impurity high-concentration layer 4 is realizable by electric connection of first trench unit 10 constituted by N-type-doped first polysilicon 16 and first conductivity type impurity diffusion layer 14 surrounding first polysilicon 16.

First trench units 10 of the vertical gate semiconductor device are disposed under the drain electrode corresponding to first electrode 34 for the purpose of size reduction of the semiconductor device. A low resistance semiconductor device is similarly producible even when first trench units 10 are disposed in an area other than the area under the drain electrode corresponding to first electrode 34.

(Manufacturing Method of First Exemplary Embodiment)

A manufacturing method of the semiconductor device according to the first exemplary embodiment is hereinafter described with reference to FIGS. 3A through 4D. FIGS. 3A through 4D are cross-sectional views illustrating steps executed in a forming process for forming the vertical gate semiconductor device having the foregoing structure. FIGS. 3A through 4D are schematic views similarly to FIG. 2, and therefore dimensional ratios of respective parts illustrated in these figures do not necessarily coincide with practical dimensional ratios.

Figure 3A:
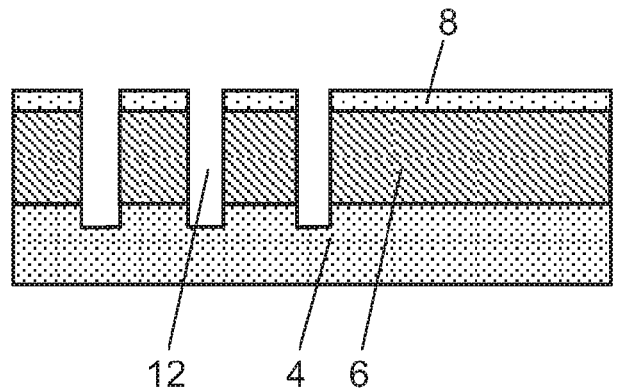
FIGS. 3A through 3D are cross-sectional views illustrating a manufacturing method of the semiconductor device according to the first exemplary embodiment.

As illustrated in FIG. 3A, N-type first conductivity type impurity low-concentration layer 6 is initially formed on N-type first conductivity type impurity high-concentration layer 4 by epitaxial growth. Then, silicon oxide film 8 having a film thickness in a range from 200 nm to 1,000 nm is formed on a front surface of N-type first conductivity type impurity low-concentration layer 6 by thermal oxidation. A resist pattern is formed on silicon oxide film 8 by a lithography technique. The resist pattern has openings in areas where respective first trenches 12 will be formed in a later step. After formation of the resist pattern, silicon oxide film 8 provided on the areas of first trenches 12 is removed by etching with a mask of the resist pattern. After removal of the resist pattern, first trenches 12 reaching N-type first conductivity type impurity high-concentration layer 4 are formed by etching with a mask of patterned silicon oxide film 8.

According to the manufacturing method, it is preferable that each of first trenches 12 has a width 0.1 times longer than a depth of each of first trenches 12, or a width longer than this length to allow oblique ion implantation for forming first conductivity type impurity diffusion layer 14 in a later step. It is further preferable that the width of each of first trenches 12 is 1 µm or shorter to reduce a number of times of deposition of the first polysilicon implanted into each of first trenches 12 in the later step.

Figure 3B:
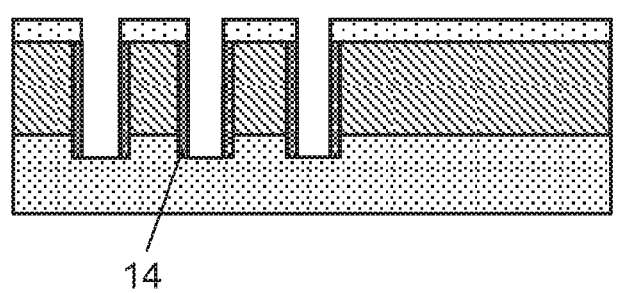

As illustrated in FIG. 3B, N-type first conductivity type impurity diffusion layer 14 is formed on the inner surface of each of formed first trenches 12 by ion implantation of phosphorus in a range from $3.0\times10^{15}$ cm$^{-2}$ to $5.0\times10^{16}$ cm$^{-2}$ with a mask of silicon oxide film 8. While phosphorus is implanted to form N-type first conductivity type impurity diffusion layer 14 in this exemplary embodiment, arsenic or antimony may be implanted in place of phosphorus. Moreover, while ions of phosphorus are implanted to form N-type first conductivity type impurity diffusion layer 14 in this exemplary embodiment, N-type first conductivity type impurity diffusion layer 14 may be formed by etching and removing natural oxide film formed on the inner surface of each of first trenches 12 after formation of first trenches 12, and carrying out gas phase diffusion of POCl$_3$ (phosphorus oxychloride).

Figure 3C:
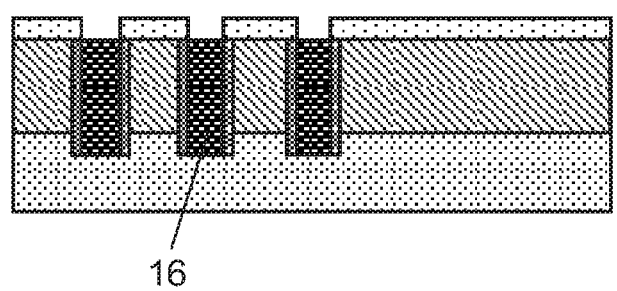

As illustrated in FIG. 3C, N-type-doped polysilicon film approximately at $5.0\times10^{20}$ cm$^{-3}$ is deposited on the front surface of silicon substrate 2 and within first trenches 12. Then, polysilicon other than first polysilicon 16 deposited within first trenches 12 is removed by polysilicon etching. It is most preferable that respective impurity concentrations of the first polysilicon and the diffusion layer are kept constant in the area between the front surface of the silicon substrate and the first conductivity impurity high-concentration layer. However, low resistance of electric connection between the front-surface electrodes and the silicon substrate, and thus production of a low resistance semiconductor device are realizable even in the presence of variations of impurity concentrations when the respective impurity concentrations are set such that the first polysilicon has an impurity concentration in a range from $5.0\times10^{19}$ cm$^{-3}$ to $5.0\times10^{21}$ cm$^{-3}$, and that the diffusion layer has an impurity concentration in a range from $1.0\times10^{19}$ cm$^{-3}$ to $1.0\times10^{21}$ cm$^{-3}$.

Figure 3D:
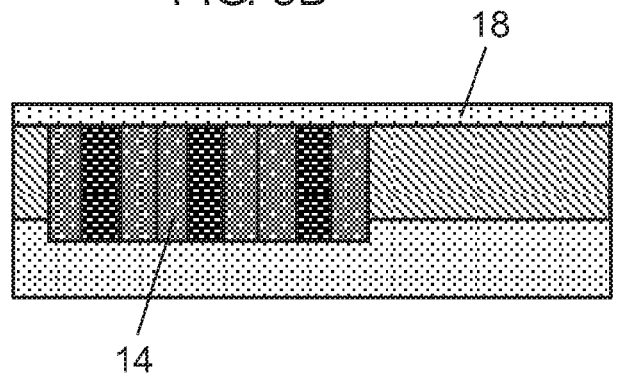

As illustrated in FIG. 3D, silicon oxide film 18 having a film thickness in a range from 50 nm to 500 nm is formed on the front surface of silicon substrate 2 by thermal oxidation. At this time, phosphorus contained in first conductivity type impurity diffusion layer 14 implanted onto the inner surface of each of first trenches 12 is thermally diffused, whereby adjoining first conductivity type impurity diffusion layers 14 implanted onto the inner surfaces of first trenches 12 are connected with each other. As a result, entire first conductivity type impurity low-concentration layer 6 positioned between first trenches 12 becomes first conductivity type impurity diffusion layer 14. When silicon oxide film 18 is formed by the thermal oxidation under conditions of 1,000° C. for 40 minutes by using a mixed gas of hydrogen and oxygen, the implanted phosphorus impurities are thermally diffused approximately by 1 µm. Accordingly, it is preferable that each interval of the plurality of first trenches 12 is set to 2.0 µm or shorter.

According to this exemplary embodiment, N-type first conductivity type impurity diffusion layer 14 has an impurity concentration of approximately $5.0\times10^{19}$ cm$^{-3}$, while first polysilicon 16 has an impurity concentration of approximately $5.0\times10^{20}$ cm$^{-3}$. The respective concentrations are kept constant in the area from the front surface of silicon substrate 2 to first conductivity type impurity high-concentration layer 4 to realize low resistance of electric connection between the drain electrode corresponding to first electrode 34 and first conductivity type impurity high-concentration layer 4. First conductivity type impurity diffusion layer 14 may be formed by thermal diffusion from N-type-doped first polysilicon 16 implanted into first trenches 12.

Figure 4A:
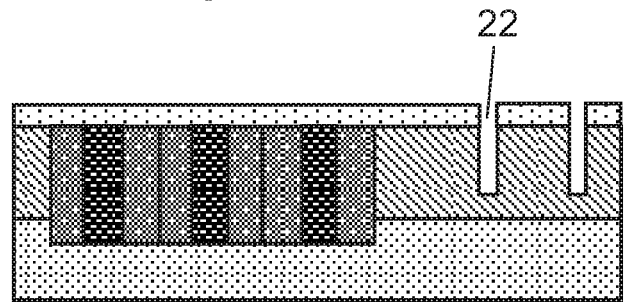
FIGS. 4A through 4D are cross-sectional views illustrating a manufacturing process of the semiconductor device according to the first exemplary embodiment.

As illustrated in FIG. 4A, a resist pattern is formed on silicon oxide film 18 by a lithography technique. This resist pattern has openings in areas where second trenches 22 will be formed in a later step. Then, silicon oxide film 18 formed on the areas of second trenches 22 is removed by etching with a mask of the resist pattern. After removal of the resist pattern, second trenches 22 are formed by dry etching with a mask of patterned silicon oxide film 18.

Figure 4B:
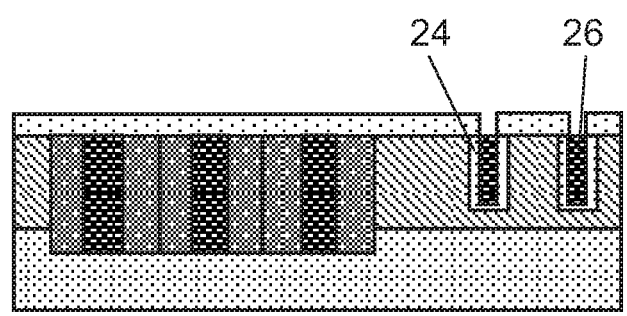

As illustrated in FIG. 4B, gate insulation film 24 having a film thickness in a range from 8 nm to 100 nm is formed on the inner surface of each of second trenches 22. Then, a conductive polysilicon film in a range from 200 nm to 800 nm constituting a gate electrode material is deposited on the front surface of silicon substrate 2 and within each of second trenches 22. A resist pattern for covering a gate polysilicon wiring forming area such as gate extension wiring is formed. The polysilicon film on silicon oxide film 18 is removed by gate polysilicon film etching with a mask of this resist pattern to form second polysilicon 26 constituting a gate electrode material.

Figure 4C:
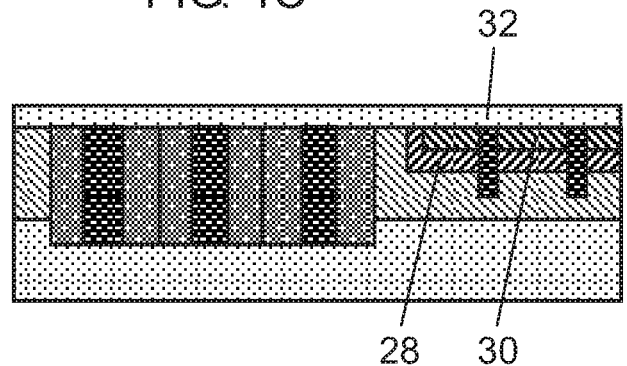

As illustrated in FIG. 4C, a resist pattern for covering an area other than body area 28 is formed. Ions of boron are implanted to form body area 28. Then, a resist pattern for covering an area other than source area 30 is formed. Ions of phosphorus are implanted to form source area 30. Thereafter, interlayer insulation film 32 is formed by a CVD (Chemical Vapor Deposition) technique.

Figure 4D:
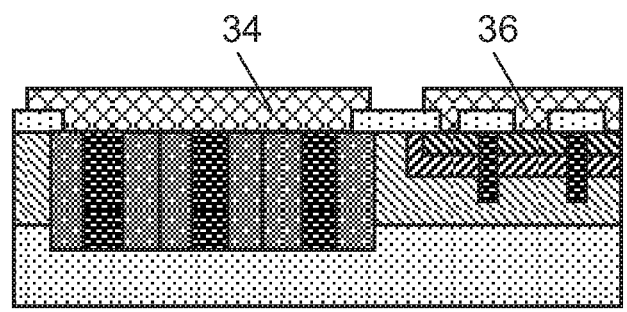

As illustrated in FIG. 4D, a resist pattern is formed on interlayer insulation film 32. This resist pattern has openings in areas where contacts with first electrode 34 corresponding to the drain electrode, second electrode 36 corresponding to the source electrode, third electrode 38 corresponding to the gate electrode will be formed. Then, contacts with the drain, source, and gate are formed by etching. After a conductive film for electric connection is provided, a resist pattern is formed on areas where first electrode 34 corresponding to the drain electrode, second electrode 36 corresponding to the source electrode, third electrode 38 corresponding to the gate electrode will be formed. Then, first electrode 34 corresponding to the drain electrode, second electrode 36 corresponding to the source electrode, and third electrode 38 corresponding to the gate electrode are formed by etching.

Figure 5:
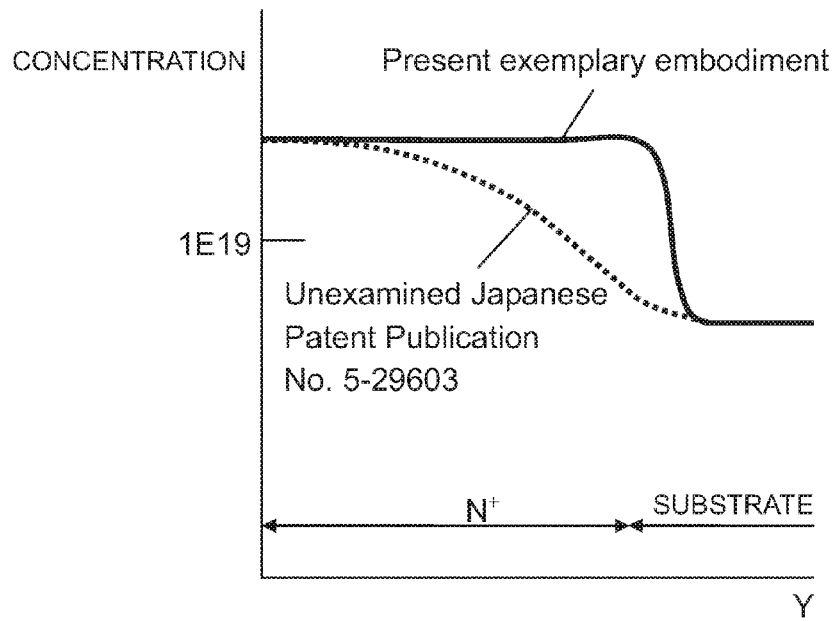
FIG. 5 is a diagram illustrating a concentration profile in a vertical direction (V direction) in FIG. 2.
Figure 6:
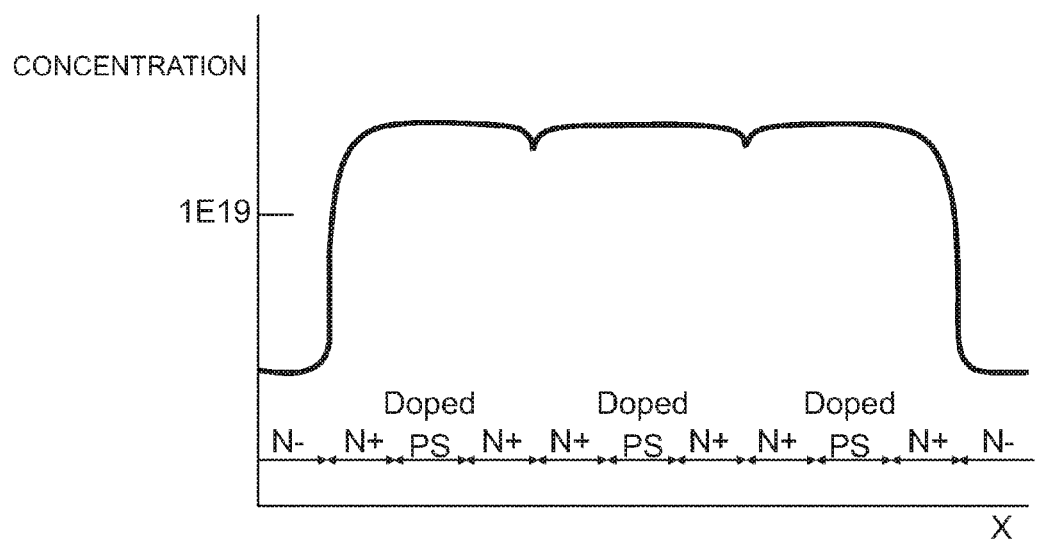
FIG. 6 is a diagram illustrating a concentration profile in a horizontal direction (Vi direction) in FIG. 2.

FIG. 5 is a diagram illustrating a concentration profile in a vertical direction (V direction) in FIG. 2. FIG. 6 is a diagram illustrating a concentration profile in a horizontal direction (Vi direction) in FIG. 2.

As illustrated in FIGS. 2 and 5, N-type first conductivity type impurity diffusion layer 14 is formed by ion implantation of uniform impurities on the inner surface of each of first trenches 12. Thus, the concentration of N-type first conductivity type impurity diffusion layer 14 becomes constant in the depth direction. According to this exemplary embodiment, N-type first conductivity type impurity diffusion layer 14 has an impurity concentration of approximately $5.0 \times 10^{19}$ cm$^{-3}$.

As illustrated in FIGS. 2 and 6, N-type first conductivity type impurity diffusion layer 14 formed on the inner surface of each of first trenches 12 is diffused by heat treatment in a later step, whereby first conductivity type impurity low-concentration layer 6 positioned between first trenches 12 is filled with first conductivity type impurity diffusion layer 14. Moreover, an interior of each of first trenches 12 is filled with N-type-doped first polysilicon 16 (Doped PS), and thus exhibits a high-concentration profile in a horizontal direction as illustrated in FIG. 6. According to this exemplary embodiment, first polysilicon 16 has an impurity concentration of approximately $5.0 \times 10^{20}$ cm$^{-3}$.

According to the vertical gate semiconductor device of the present disclosure as described above, low resistance of electric connection between the drain electrode corresponding to first electrode 34 and N-type first conductivity type impurity high-concentration layer 4 is realizable by electric connection of first trench unit 10 constituted by N-type-doped first polysilicon 16 and first conductivity type impurity diffusion layer 14 surrounding first polysilicon 16.

Second Exemplary Embodiment

A semiconductor device according to a second exemplary embodiment is hereinafter described with reference to FIG. 7. Discussed in this exemplary embodiment is an NPN-type vertical bipolar semiconductor device embodying the present disclosure. According to this exemplary embodiment, a first conductivity type corresponds to N-type, while a second conductivity type corresponds to P-type. The following description is applicable to a PNP-type vertical transistor semiconductor device as well when conductivity types of respective impurity areas within the element are reversed.

Figure 7:
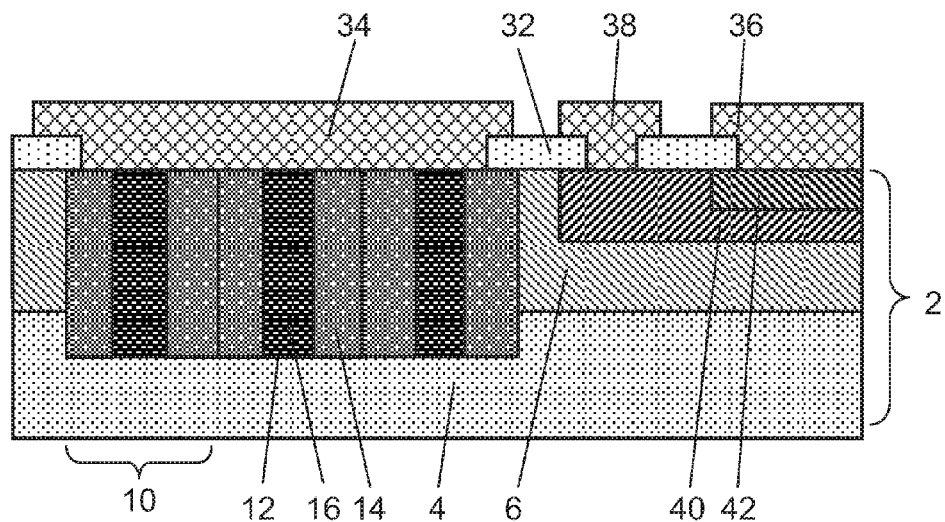
FIG. 7 is a cross-sectional view illustrating a configuration of a semiconductor device according to a second exemplary embodiment.

FIG. 7 is a cross-sectional view illustrating the vertical transistor semiconductor device according to the present disclosure.

As illustrated in FIG. 7, the vertical transistor semiconductor device according to this exemplary embodiment includes a collector electrode corresponding to first electrode 34, an emitter electrode corresponding to second electrode 36, and a base electrode corresponding to third electrode 38, all of which electrodes 34, 36, and 38 are disposed on the front surface of silicon substrate 2. Similarly to the foregoing vertical gate semiconductor device, first trench unit 10 constituted by N-type first conductivity type impurity diffusion layer 14 and N-type-doped first polysilicon 16 is formed under the collector electrode corresponding to first electrode 34. Base area 40 is constituted by a P-type impurity area having a higher concentration than a concentration of N-type first conductivity type impurity low-concentration layer 6. Base area 40 provided on N-type first conductivity type impurity low-concentration layer 6 is located at a position shallower than the position of N-type first conductivity type impurity low-concentration layer 6. Emitter area 42 constituted by an N-type impurity area having a higher concentration than the concentration of base area 40 is provided on base area 40 at a position shallower than the position of base area 40.

Positive voltage with respect to the emitter electrode corresponding to second electrode 36 is applied to the collector electrode corresponding to first electrode 34, while positive voltage with respect to the emitter electrode corresponding to second electrode 36 is applied to the base electrode corresponding to third electrode 38. As a result, current flows from the collector electrode corresponding to first electrode 34, through first trench unit 10, first conductivity type impurity high-concentration layer 4, first conductivity type impurity low-concentration layer 6, base area 40, and emitter area 42, toward the emitter electrode corresponding to second electrode 36. Low resistance of electric connection between the collector electrode corresponding to first electrode 34 and N-type first conductivity type impurity high-concentration layer 4 is realizable by electric connection of first trench unit 10 constituted by N-type-doped first polysilicon 16 and first conductivity type impurity diffusion layer 14 surrounding first polysilicon 16.

Third Exemplary Embodiment

A semiconductor device according to a third exemplary embodiment is hereinafter described with reference to FIG. 8. Discussed in this exemplary embodiment is a PN-type vertical diode semiconductor device embodying the present disclosure. According to this exemplary embodiment, a first conductivity type corresponds to N-type, while a second conductivity type corresponds to P-type. The following description is applicable to an NP-type vertical diode semiconductor device as well when conductivity types of respective impurity areas within the element are reversed.

Figure 8:
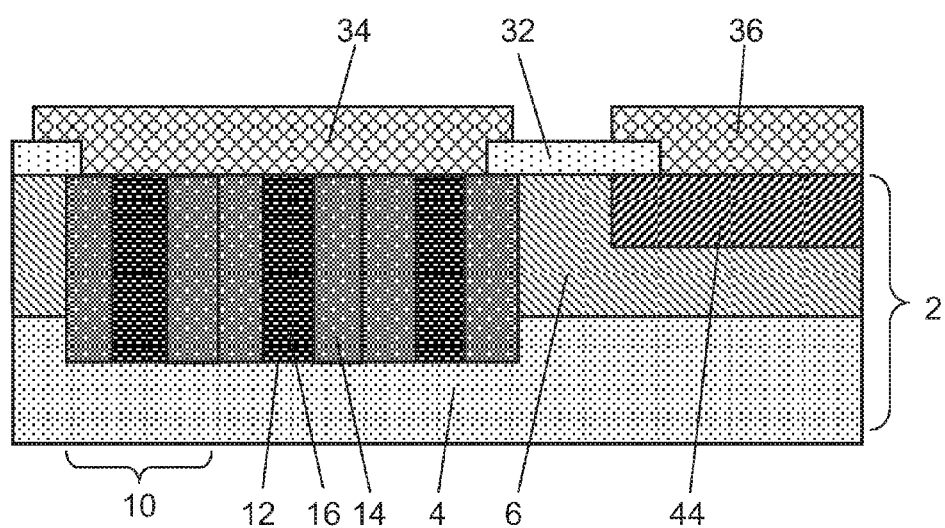
FIG. 8 is a cross-sectional view illustrating a configuration of a semiconductor device according to a third exemplary embodiment.

FIG. 8 is a cross-sectional view illustrating a vertical diode semiconductor device according to the present disclosure.

As illustrated in FIG. 8, the vertical diode semiconductor device according to this exemplary embodiment includes a cathode electrode corresponding to first electrode 34, and an anode electrode corresponding to second electrode 36, both of which electrodes 34 and 36 are disposed on the front surface of silicon substrate 2. Similarly to the foregoing vertical gate semiconductor device, first trench unit 10 constituted by N-type first conductivity type impurity diffusion layer 14 and N-type-doped first polysilicon 16 is formed under the cathode electrode corresponding to first electrode 34. Anode area 44 is constituted by a P-type impurity area having a higher concentration than a concentration of N-type first conductivity type impurity low-concentration layer 6. Anode area 44 provided on N-type first conductivity type impurity low-concentration layer 6 is located at a position shallower than the position of N-type first conductivity type impurity low-concentration layer 6.

When negative voltage with respect to the anode electrode corresponding to second electrode 36 is applied to the cathode electrode corresponding to first electrode 34, current flows from the anode electrode corresponding to second electrode 36, through anode area 44, first conductivity type impurity low-concentration layer 6, first conductivity type impurity high-concentration layer 4, and first trench unit 10, toward the cathode electrode corresponding to first electrode 34. Low resistance of electric connection between the cathode electrode corresponding to first electrode 34 and N-type first conductivity type impurity high-concentration layer 4 is realizable by electric connection of first trench unit 10 constituted by N-type-doped first polysilicon 16 and first conductivity type impurity diffusion layer 14 surrounding first polysilicon 16.

Fourth Exemplary Embodiment

Figure 9:
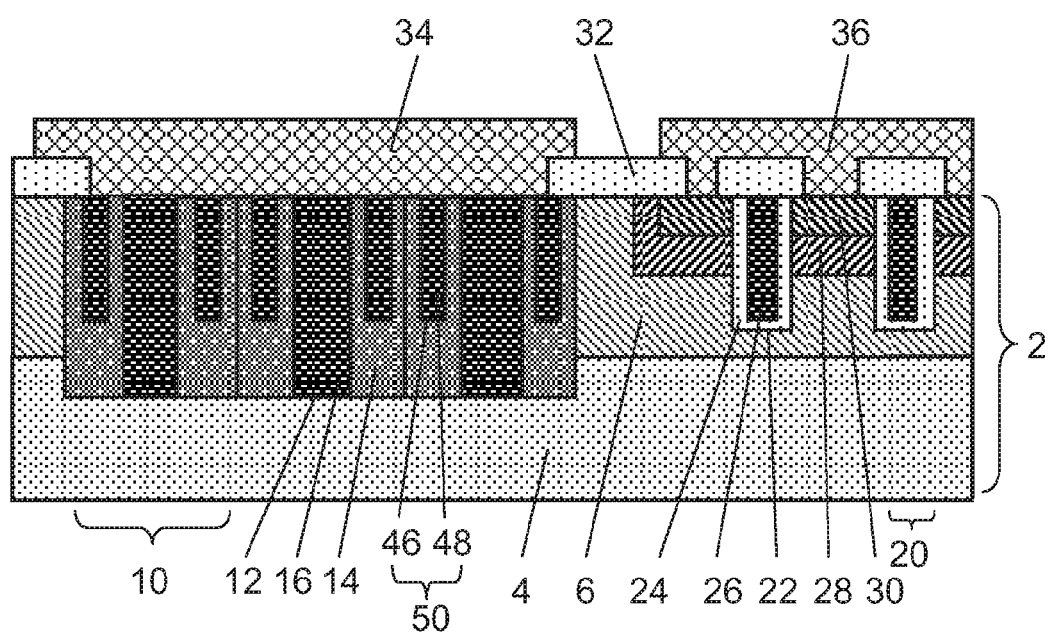
FIG. 9 is a cross-sectional view illustrating a configuration of a semiconductor device according to a fourth exemplary embodiment.

A semiconductor device according to a fourth exemplary embodiment is hereinafter described with reference to FIGS. 9 and 10. FIG. 9 is a cross-sectional view illustrating a vertical gate semiconductor device according to the present disclosure.

As illustrated in FIG. 9, the vertical gate semiconductor device according to this exemplary embodiment includes third trenches 46 formed in first conductivity type impurity diffusion layer 14 surrounding first polysilicon 16, and N-type-doped third polysilicon 48 formed within third trenches 46. An impurity concentration of N-type-doped third polysilicon 48 is higher than the impurity concentration of first conductivity type impurity diffusion layer 14. Accordingly, lower resistance of electric connection is realized between the drain electrode corresponding to first electrode 34 and N-type first conductivity type impurity high concentration layer 4 than the corresponding electric connection of the vertical gate semiconductor device according to the first exemplary embodiment.

A manufacturing method of the vertical gate semiconductor device illustrated in FIG. 9 is hereinafter described. The manufacturing method of the vertical gate semiconductor device illustrated in FIG. 9 is different from the manufacturing method of the vertical gate semiconductor device illustrated in FIG. 2 only after formation of second trenches 22, and therefore only processes after formation of second trenches 22 are discussed herein. FIGS. 10A through 10D are cross-sectional views illustrating steps executed in a forming process for forming the vertical gate semiconductor device having the structure described above. Similarly to FIG. 9, FIGS. 10A through 10D are only schematic views, and dimensional ratios of respective parts illustrated in the figures do not necessarily coincide with practical dimensional ratios.

Figure 10A:
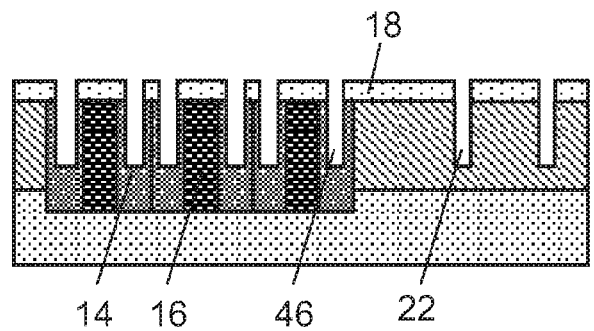
FIGS. 10A through 10D are cross-sectional views illustrating a manufacturing method of the semiconductor device according to the fourth exemplary embodiment.

After formation of first trench units as illustrated in FIG. 3D, a step illustrated in FIG. 10A is executed. As illustrated in FIG. 10A, a resist pattern is formed on silicon oxide film 18 by a lithography technique. This resist pattern has openings in areas where respective second trenches 22 will be formed in a later step, and in areas where respective third trenches 46 will be formed in first conductivity type impurity diffusion layer 14. After formation of the resist pattern, silicon oxide film 18 provided on the areas of second trenches 22 and third trenches 46 is removed by etching with a mask of the resist pattern. After removal of the resist pattern, second trenches 22 and third trenches 46 are formed by etching with a mask of patterned silicon oxide film 18.

Figure 10B:
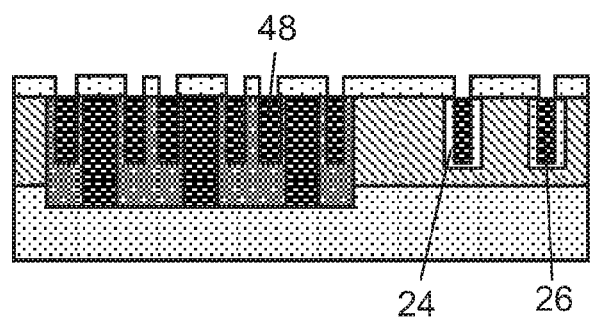

As illustrated in FIG. 10B, gate insulation film 24 having a film thickness in a range from 8 nm to 100 nm is formed on an inner surface of each of second trenches 22 and third trenches 46. Then, a resist pattern having openings at positions of third trenches 46 is formed by a lithography technique, and then gate insulation film 24 within third trenches 46 is etched by etching. After the resist pattern is removed, a conductive polysilicon film in a range from 200 nm to 800 nm constituting a gate electrode material is deposited on the entire surface. Then, a resist pattern for covering a polysilicon wiring forming area such as gate extension wiring is formed. The polysilicon film on silicon oxide film 18 is removed by polysilicon film etching with a mask of the resist pattern to form second polysilicon 26 within second trenches 22 and third polysilicon 48 within third trenches 46.

Figure 10C:
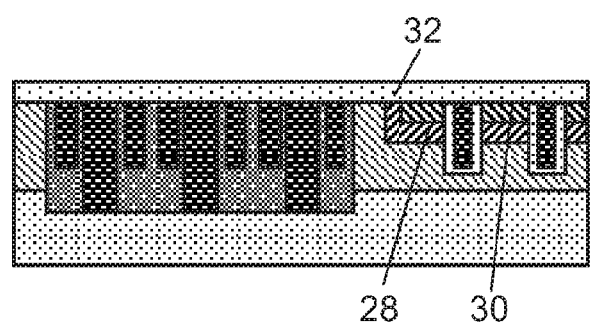

As illustrated in FIG. 10C, a resist pattern for covering an area other than body area 28 is formed. Ions of boron are implanted to form body area 28. Then, a resist pattern for covering an area other than source area 30 is formed. Ions of phosphorus are implanted to form source area 30. Thereafter, interlayer insulation film 32 is formed by a CVD technique.

Figure 10D:
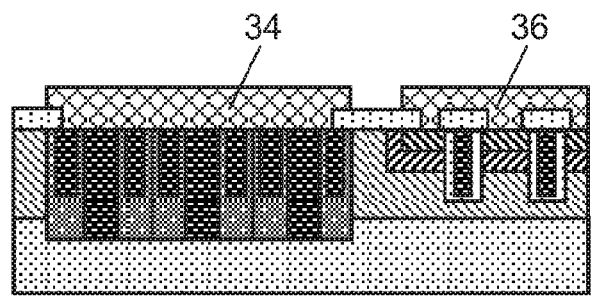

As illustrated in FIG. 10D, a resist pattern is formed on interlayer insulation film 32. This resist pattern has openings in areas where contacts with first electrode 34 corresponding to the drain electrode, second electrode 36 corresponding to the source electrode, and third electrode 38 corresponding to the gate electrode will be formed. Then, contacts with the drain, source, and gate are formed by etching. After a conductive film for electric connection is provided, a resist pattern is formed on areas where first electrode 34 corresponding to the drain electrode, second electrode 36 corresponding to the source electrode, third electrode 38 corresponding to the gate electrode will be formed. Then, first electrode 34 corresponding to the drain electrode, second electrode 36 corresponding to the source electrode, and third electrode 38 corresponding to the gate electrode are formed by etching.

According to the vertical gate semiconductor device of the present disclosure as described above, electric connection between the drain electrode corresponding to first electrode 34 and N-type first conductivity type impurity high-concentration layer 4 is realizable by third trench unit 50 constituted by N-type-doped first polysilicon 16, first conductivity type impurity diffusion layer 14 surrounding first polysilicon 16, and third polysilicon 48 formed within first conductivity type impurity diffusion layer 14. Accordingly, lower resistance of electric connection than the corresponding electric connection of the vertical gate semiconductor device of the first exemplary embodiment is achievable.

Fifth Exemplary Embodiment

Figure 11:
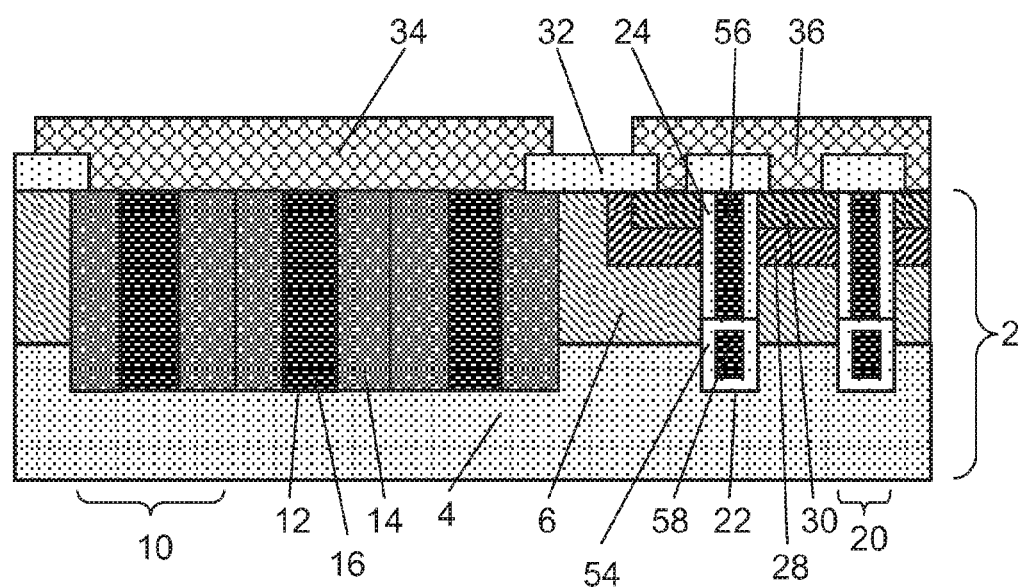
FIG. 11 is a cross-sectional view illustrating a configuration of a semiconductor device according to a fifth exemplary embodiment.

A semiconductor device according to a fifth exemplary embodiment is hereinafter described with reference to FIGS. 11 through 13D. FIG. 11 is a cross-sectional view illustrating the vertical gate semiconductor device according to the present disclosure.

As illustrated in FIG. 11, the vertical gate semiconductor device according to this exemplary embodiment includes second trenches 22 having a substantially equal depth with first trenches 12. First trenches 12 and second trenches 22 are simultaneously formed. Each of the second trenches includes fifth polysilicon 58, source insulation film 54, gate insulation film 24, and fourth polysilicon 56 corresponding to a gate electrode. Fifth polysilicon 58 has a potential identical to a potential of a source electrode, and source insulation film 54 is formed around fifth polysilicon 58.

According to the vertical gate semiconductor device of this exemplary embodiment, first trenches 12 and second trenches 22 are simultaneously formed. Thus, smaller number of masks are needed for realizing low resistance of electric connection equivalent to the corresponding electric connection of the vertical gate semiconductor device according to the first exemplary embodiment between a drain electrode corresponding to first electrode 34 and N-type first conductivity type impurity high-concentration layer 4. Furthermore, more preferable switching characteristics and breakdown voltage characteristics, and lower ON-resistance characteristics are offered in comparison with the corresponding characteristics of the vertical gate semiconductor device according to the first exemplary embodiment.
(Manufacturing Method in Fifth Exemplary Embodiment)

A manufacturing method of the semiconductor device according to the fifth exemplary embodiment is hereinafter described with reference to FIGS. 12A through 13D.

FIGS. 12A through 13D are cross-sectional views illustrating steps executed in a forming process for forming the vertical gate semiconductor device having the structure illustrated in FIG. 11. Similarly to FIG. 11, FIGS. 12A through 13D are only schematic views, and dimensional ratios of respective parts illustrated in the figures do not necessarily coincide with practical dimensional ratios.

Figure 12A:
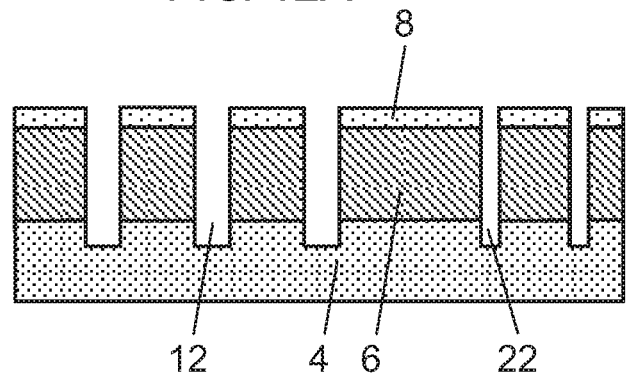
FIGS. 12A through 12D are cross-sectional views illustrating a manufacturing method of the semiconductor device according to the fifth exemplary embodiment.

As illustrated in FIG. 12A, N-type first conductivity type impurity low-concentration layer 6 is initially formed on N-type first conductivity type impurity high-concentration layer 4 by epitaxial growth. Then, silicon oxide film 8 having a film thickness in a range from 200 nm to 1,000 nm is formed on a surface of N-type first conductivity type impurity low-concentration layer 6 by thermal oxidation. A resist pattern is formed in silicon oxide film 8 by a lithography technique. This resist pattern has openings in areas where respective first trenches 12 and second trenches 22 will be formed in a later step. After formation of the resist pattern, silicon oxide film 8 provided on the areas of first trenches 12 and second trenches 22 is removed by etching with a mask of the resist pattern. After removal of the resist pattern, first trenches 12 and second trenches 22 reaching N-type first conductivity type impurity high-concentration layer 4 are formed by etching with a mask of patterned silicon oxide film 8 as illustrated in FIG. 12A.

Figure 12B:
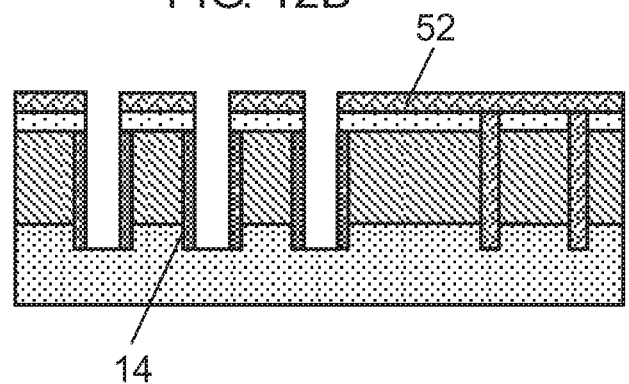

As illustrated in FIG. 12B, resist pattern 52 having openings at positions of first trenches 12 is formed by a lithography technique. N-type first conductivity type impurity diffusion layer 14 is formed on the inner surface of each of first trenches 12 by ion implantation of phosphorus in a range from $3.0 \times 10^{15}$ cm$^{-2}$ to $5.0 \times 10^{16}$ cm$^{-2}$ with a mask of resist pattern 52.

Figure 12C:
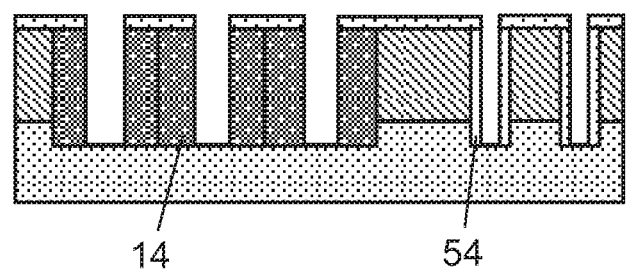

As illustrated in FIG. 12C, resist pattern 52 is removed, and silicon oxide film 8 is further removed by etching. Thereafter, source insulation film 54 is formed by thermal oxidation or a CVD technique. By the thermal diffusion at the time of formation of source insulation film 54, adjoining first conductivity type impurity diffusion layers 14 implanted onto the inner surfaces of first trenches 12 are connected with each other. As a result, entire first conductivity type impurity low-concentration layer 6 positioned between first trenches 12 becomes first conductivity type impurity diffusion layer 14. After a resist pattern having openings at the positions of first trenches 12 is formed by a lithography technique, source insulation film 54 on the inner surfaces of first trenches 12 is etched by etching with a mask of the resist pattern.

Figure 12D:
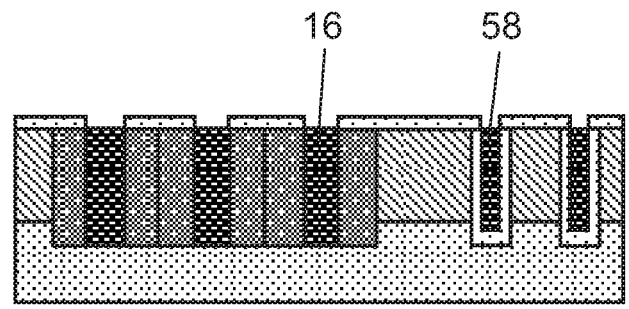

As illustrated in FIG. 12D, N-type-doped polysilicon film approximately at $5.0 \times 10^{20}$ cm$^{-3}$ is deposited on the front surface of silicon substrate 2 and within first trenches 12 and second trenches 22. Then, polysilicon other than first polysilicon 16 within first trenches 12 and fifth polysilicon 58 within second trenches 22 is removed by polysilicon etching.

Figure 13A:
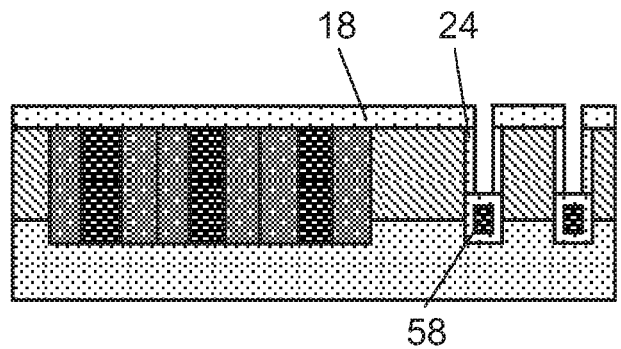
FIGS. 13A through 13D are cross-sectional views illustrating the manufacturing method of the semiconductor device according to the fifth exemplary embodiment.

As illustrated in FIG. 13A, source insulation film 54 formed on the front surface of silicon substrate 2 is etched, and then silicon oxide film 18 having a film thickness in a range from 50 nm to 500 nm is formed on the front surface of silicon substrate 2 by thermal oxidation. After a resist pattern having openings at the positions of second trenches 22 is formed on silicon oxide film 18 by a lithography technique, silicon oxide film 18 formed on second trenches 22 is removed by etching with a mask of the resist pattern. After removal of the resist pattern, an upper part of fifth polysilicon 58 formed within second trenches 22 is etched by etching with a mask of patterned silicon oxide film 18. Then, source insulation film 54 formed on the inner surfaces of second trenches 22 is etched by etching, and then gate insulation film 24 having a film thickness in a range from 8 nm to 100 nm is formed on the inner surfaces of second trenches 22.

Figure 13B:
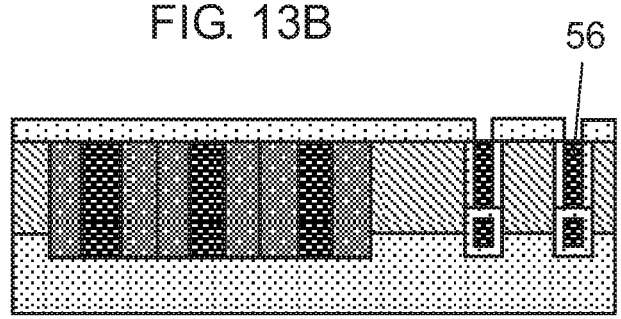

As illustrated in FIG. 13B, a conductive polysilicon film in a range from 200 nm to 800 nm constituting a gate electrode material is deposited on the front surface of silicon substrate 2 and within second trenches 22. A resist pattern for covering a gate polysilicon wiring forming area such as gate extension wiring is formed. The polysilicon film on silicon oxide film 18 is removed by gate polysilicon film etching with a mask of the resist pattern to form fourth polysilicon 56 constituting a gate electrode.

Figure 13C:
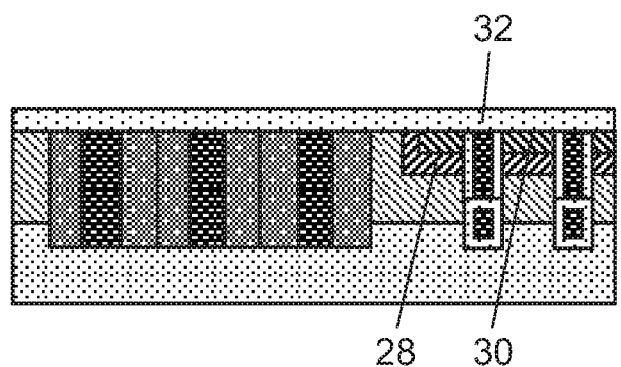

As illustrated in FIG. 13C, a resist pattern for covering an area other than body area 28 is formed. Ions of boron are implanted to form body area 28. Then, a resist pattern for covering an area other than source area 30 is formed. Ions of phosphorus are implanted to form source area 30. Thereafter, interlayer insulation film 32 is formed by a CVD technique.

Figure 13D:
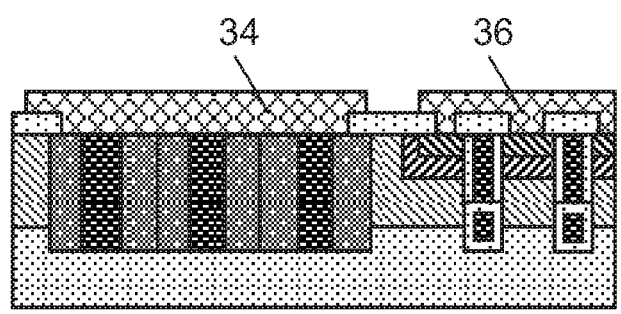

As illustrated in FIG. 13D, a resist pattern is formed in interlayer insulation film 32. This resist pattern has openings in areas where contacts with first electrode 34 corresponding to the drain electrode, second electrode 36 corresponding to the source electrode, and third electrode 38 corresponding to the gate electrode will be formed. The contacts with the drain, source, and gate are formed by etching. After a conductive film for electric connection is provided, a resist pattern is formed on areas where first electrode 34 corresponding to the drain electrode, second electrode 36 corresponding to the source electrode, and third electrode 38 corresponding to the gate electrode will be formed. Then, first electrode 34 corresponding to the drain electrode, second electrode 36 corresponding to the source electrode, and third electrode 38 corresponding to the gate electrode are formed by etching.

According to the vertical gate semiconductor device of this exemplary embodiment as described above, first trenches 12 and second trenches 22 are simultaneously formed. In this case, by using a smaller number of masks, low resistance of electric connection equivalent to the corresponding electric connection of the vertical gate semiconductor device according to the first exemplary embodiment is realized between a drain electrode corresponding to first electrode 34 and N-type first conductivity type impurity high-concentration layer 4.

Sixth Exemplary Embodiment

Figure 14:
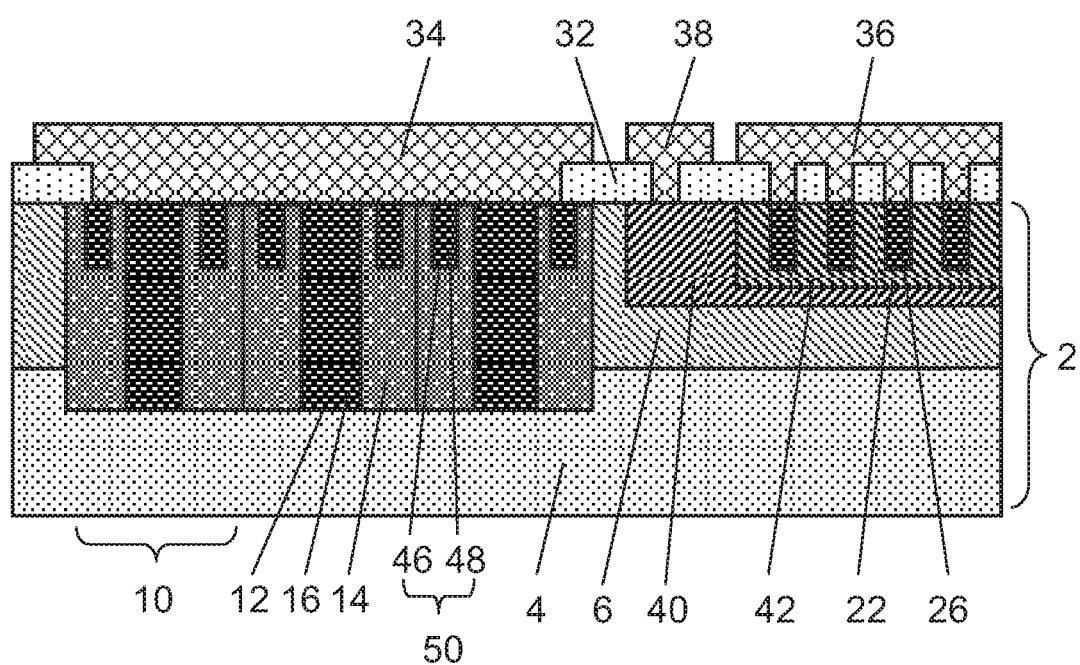
FIG. 14 is a cross-sectional view illustrating a configuration of a semiconductor device according to a sixth exemplary embodiment.

A semiconductor device according to a sixth exemplary embodiment is hereinafter described with reference to FIG. 14. FIG. 14 is a cross-sectional view illustrating a vertical bipolar semiconductor device according to the present disclosure.

As illustrated in FIG. 14, a collector electrode corresponding to first electrode 34, an emitter electrode corresponding to second electrode 36, and a base electrode corresponding to third electrode 38 are formed on the front surface of silicon substrate 2. First trench unit 10 constituted by N-type first conductivity type impurity diffusion layer 14 and N-type-doped first polysilicon 16, and third trench unit 50 constituted by N-type-doped third polysilicon 48 are formed under the collector electrode corresponding to first electrode 34. Base area 40 is constituted by a P-type impurity area having a higher concentration than a concentration of N-type first conductivity type impurity low-concentration layer 6. Base area 40 provided on N-type first conductivity type impurity low-concentration layer 6 is located at a position shallower than the position of N-type first conductivity type impurity low-concentration layer 6. Emitter area 42 constituted by an N-type impurity area having a higher concentration than the concentration of base area 40 is provided on base area 40 at a position shallower than the position of base area 40. N-type-doped second polysilicon 26 provided on emitter area 42 is located at a position shallower than the position of emitter area 42.

The vertical bipolar semiconductor device illustrated in FIG. 14 and the vertical bipolar semiconductor device illustrated in FIG. 7 are different in a manufacturing method of emitter area 42. According to the vertical bipolar semiconductor device illustrated in FIG. 14, a silicon oxide film is formed after formation of base area 40. After formation of the silicon oxide film, the silicon oxide film formed in areas where second trenches 22 will be formed in a later step and in areas where third trenches 46 will be formed in a later step is etched and patterned. Then, second trenches 22 and third trenches 46 are formed in base area 40 and N-type first conductivity type impurity diffusion layer 14, respectively, by etching with a mask of the patterned silicon oxide film. After a natural oxide film is etched, an N-type conductive polysilicon film in a range from 200 nm to 800 nm constituting an emitter electrode material is deposited on the entire surface. After the polysilicon film formed on the silicon oxide film is removed by polysilicon film etching, second polysilicon 26 within second trenches 22, and third polysilicon 48 within third trenches 46 are formed. Then, N-type impurities are diffused from second polysilicon 26 by thermal treatment to form emitter area 42. Thereafter, interlayer insulation film 32 is formed by a CVD technique to produce electrodes.

Positive voltage with respect to the emitter electrode corresponding to second electrode 36 is applied to the collector electrode corresponding to first electrode 34, while positive voltage with respect to the emitter electrode corresponding to second electrode 36 is applied to the base electrode corresponding to third electrode 38. As a result, current flows from the collector electrode corresponding to first electrode 34, through first trench unit and third trench unit 50, first conductivity type impurity high-concentration layer 4, first conductivity type impurity low-concentration layer 6, base area 40, emitter area 42, and N-type-doped second polysilicon 26, toward the emitter electrode corresponding to second electrode 36. Low resistance of electric connection between the collector electrode corresponding to first electrode 34 and N-type first conductivity type impurity high-concentration layer 4 is realizable by electric connection of first trench unit 10 constituted by N-type-doped first polysilicon 16 and first conductivity type impurity diffusion layer 14 surrounding first polysilicon 16, and third trench unit 50 constituted by N-type-doped third polysilicon 48.

Seventh Exemplary Embodiment

Figure 15:
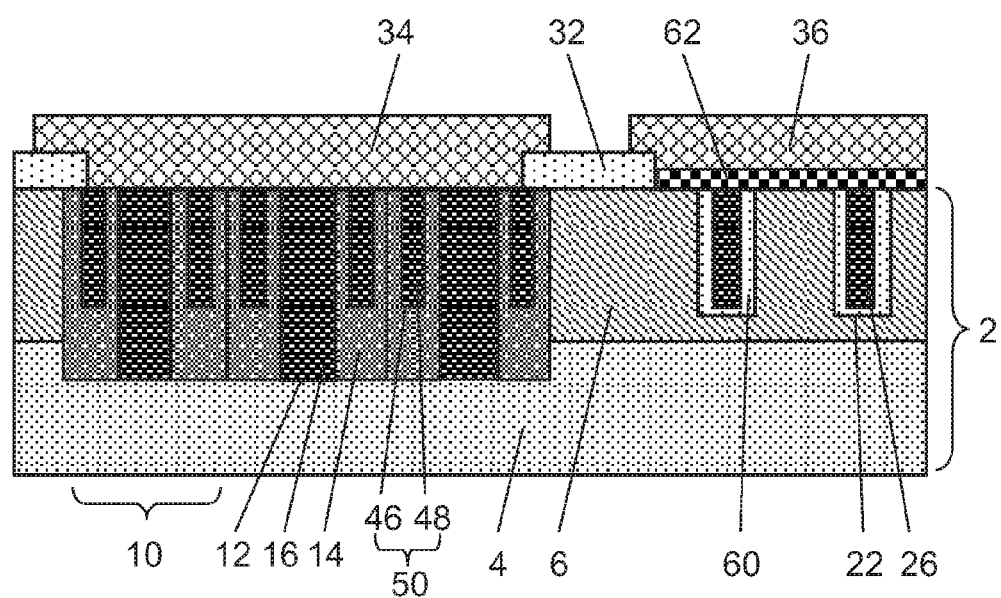
FIG. 15 is a cross-sectional view illustrating a configuration of a semiconductor device according to a seventh exemplary embodiment.

A semiconductor device according to a seventh exemplary embodiment is hereinafter described with reference to FIG. 15. FIG. 15 is a cross-sectional view illustrating a vertical diode semiconductor device according to the present disclosure.

As illustrated in FIG. 15, the vertical diode semiconductor device according to this exemplary embodiment includes a cathode electrode corresponding to first electrode 34, and an anode electrode corresponding to second electrode 36, both of which electrodes 34 and 36 are disposed on the front surface of silicon substrate 2. First trench unit 10 constituted by N-type first conductivity type impurity diffusion layer 14 and N-type-doped first polysilicon 16, and third trench unit 50 constituted by N-type-doped third polysilicon 48 are formed under the cathode electrode corresponding to first electrode 34. Second trenches 22 provided on N-type first conductivity type impurity low-concentration layer 6 are located at positions shallower than the position of N-type first conductivity type impurity low-concentration layer 6. Anode insulation film 60 and N-type-doped second polysilicon 26 are provided on inner surfaces of second trenches 22. Schottky metal 62 is formed on the surface of N-type first conductivity type impurity low-concentration layer 6 including an upper part of second polysilicon 26. The anode electrode corresponding to second electrode 36 is formed on Schottky metal 62. N-type first conductivity type impurity low-concentration layer 6 and Schottky metal 62 constitute a Schottky diode.

The vertical diode semiconductor device illustrated in FIG. 15 and the vertical diode semiconductor device illustrated in FIG. 8 are different in a manufacturing method of the anode. According to the vertical diode semiconductor device illustrated in FIG. 15, a silicon oxide film is removed after formation of first trench units 10, and then a silicon oxide film is formed by thermal oxidation. After the silicon oxide film formed in areas where second trenches 22 and third trenches 46 will be formed in later steps is etched and patterned, second trenches 22 and third trenches 46 are formed in N-type first conductivity type impurity low-concentration layer 6 and N-type first conductivity type impurity diffusion layer 14, respectively, by etching with a mask of the patterned silicon oxide film. Then, oxide films are formed on the front surface of silicon substrate 2 and inner surfaces of second trenches 22 and third trenches 46 by thermal oxidation. A resist pattern is formed by a lithography technique. The silicon oxide film formed in an area where Schottky metal 62 will be formed in a later step is removed by etching. Thereafter, formation of Schottky metal 62, and formation of interlayer insulation film 32 by using a CVD technique are completed to produce electrodes.

When negative voltage with respect to the anode electrode corresponding to second electrode 36 is applied to the cathode electrode corresponding to first electrode 34, current flows from the anode electrode corresponding to second electrode 36, through Schottky metal 62, first conductivity type impurity low-concentration layer 6, first conductivity type impurity high-concentration layer 4, and first trench unit 10 and third trench unit 50, toward the cathode electrode corresponding to first electrode 34. Low resistance of electric connection between the cathode electrode corresponding to first electrode 34 and N-type first conductivity type impurity high-concentration layer 4 is realizable by electric connection of first trench unit 10 constituted by N-type-doped first polysilicon 16 and first conductivity type impurity diffusion layer 14 surrounding first polysilicon 16, and third trench unit 50 constituted by N-type-doped third polysilicon 48. Reduction of leak current between the anode and the cathode is achievable by producing the anode from Schottky metal 62 and first conductivity type impurity low-concentration layer 6.

Moreover, anode insulation film 60 and second polysilicon 26 having a potential identical to potentials of the anode electrode corresponding to second electrode 36 are formed on the inner surfaces of second trenches 22. In this case, a depletion layer expands in the vicinity of second trenches 22 of low-concentration layer 6 when a voltage producing a state of high voltage at the cathode electrode corresponding to first electrode 34 is applied between the anode electrode corresponding to second electrode 36 and the cathode electrode corresponding to first electrode 34. Accordingly, withstand voltage is more easily securable in comparison with a structure not including second trenches 22, anode insulation film 60, and second polysilicon 26. According to this structure, second trenches 22, anode insulation film 60, second polysilicon 26, and third trench unit 50 are not essential to Schottky diode operation. In other words, Schottky diode is operable between the anode electrode corresponding to second electrode 36 and the cathode electrode corresponding to first electrode 34 even when the structure of the foregoing parts is absent. Low resistance of electric connection is achievable based on the presence of first trench units 10.

Eighth Exemplary Embodiment

Figure 16:
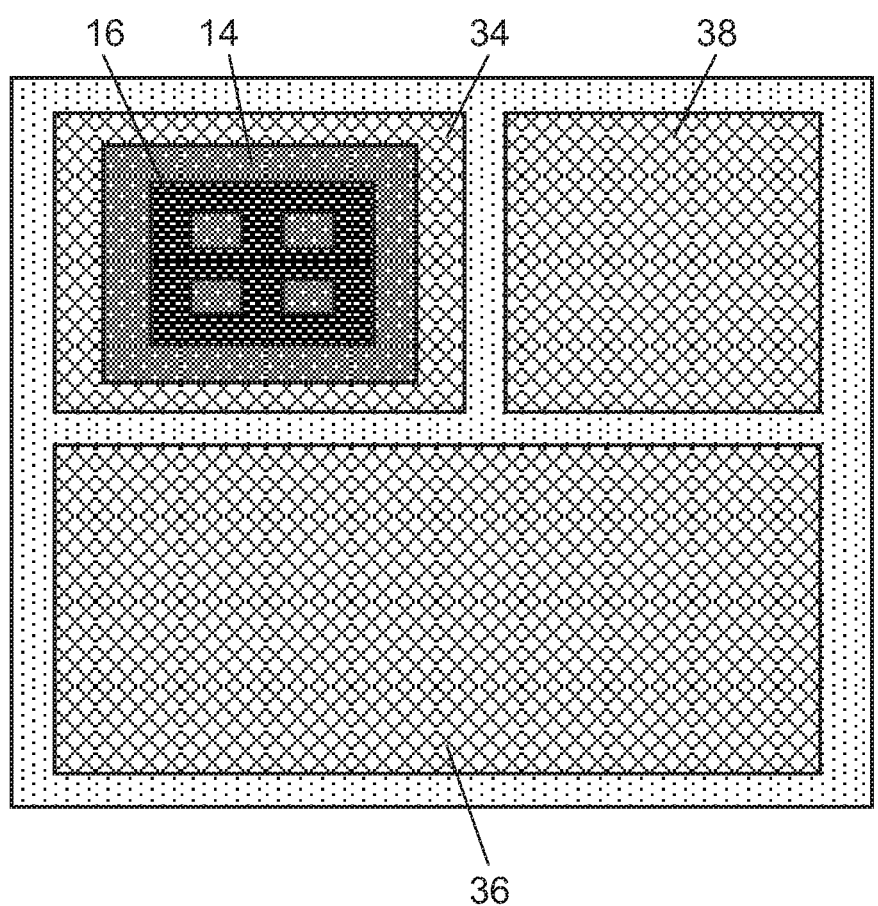
FIG. 16 is a cross-sectional view illustrating a configuration of a semiconductor device according to an eighth exemplary embodiment.

A semiconductor device according to an eighth exemplary embodiment is hereinafter described with reference to FIG. 16. FIG. 16 is a plan view illustrating a vertical gate semiconductor device according to the present disclosure. In FIG. 16, only positions of first polysilicon 16 and first conductivity type impurity diffusion layer 14 in plain view are shown for illustrative purpose.

As illustrated in FIG. 16, the vertical gate semiconductor device according to this exemplary embodiment is different from the vertical gate semiconductor device illustrated in FIG. 1 in the position of first polysilicon 16 implanted in first trenches 12, and the position of first conductivity type impurity diffusion layer 14 surrounding first polysilicon 16. According to this exemplary embodiment illustrated in FIG. 16, an area of first polysilicon 16 per unit area is larger than an area of first polysilicon 16 per unit area of the vertical gate semiconductor device illustrated in FIG. 1, while a concentration of first polysilicon 16 illustrated in FIG. 16 is higher than a concentration of first conductivity type impurity diffusion layer 14. In this case, an impurity concentration per unit area increases, and thus lower resistance of electric connection than the corresponding electric connection of the vertical gate semiconductor device according to the first exemplary embodiment is realized between a drain electrode corresponding to first electrode 34 and N-type first conductivity type impurity high-concentration layer 4.

The first through eighth exemplary embodiments have been described by way of examples of the technology disclosed in the present application. However, the technology according to the present disclosure is not limited to these exemplary embodiments, but may be applied to exemplary embodiments in which modifications, replacements, additions, omissions and the like are appropriately made.

Accordingly, respective constituent elements described and depicted in the detailed explanation and accompanying drawings may include not only constituent elements essential to solutions to problems, but also constituent elements presented only by way of example of the technology and not essential to solutions to problems. It should not be immediately considered that the constituent elements other than the essential elements are essential only based on the fact that the constituent elements other than the essential elements are described or depicted in the detailed description or accompanying drawings.

The respective exemplary embodiments have been presented only by way of example of the technology in the present disclosure. Various modifications, replacements, additions, omissions and the like may be made without departing from the scope of the appended claims or equivalents.

The present disclosure is applicable to a semiconductor device mounted on an electronic apparatus, and becomes particularly useful when employed as a low power consumption type vertical semiconductor device.

What is claimed is:
1. A semiconductor device comprising:
    a silicon substrate that includes a high-concentration layer containing first conductivity type impurities;
    a low-concentration layer formed on the high-concentration layer and containing first conductivity type impurities at a concentration lower than a concentration of the high-concentration layer;
    a first electrode and a second electrode formed on the low-concentration layer;
    a vertical semiconductor element that allows current to flow between the second electrode and the high-concentration layer; and
    a first trench unit that realizes electric connection between the first electrode and the high-concentration layer,
    wherein the first trench unit consists of first polysilicon containing first conductivity type impurities, and a diffusion layer configured to surround the first polysilicon in a plan view and to contain first conductivity type impurities, the first polysilicon is configured to reach the high-concentration layer from an upper surface of the low-concentration layer by penetrating the low-concentration layer, and respective concentrations of the first conductivity type impurities contained in the first polysilicon and in the diffusion layer are kept constant in a direction from the low-concentration layer to the high-concentration layer.

2. The semiconductor device according to claim 1, wherein the first trench unit is formed under the first electrode.

3. The semiconductor device according to claim 2, wherein the vertical semiconductor element includes a second trench unit into which second polysilicon containing first conductivity type impurities is implanted.

4. The semiconductor device according to claim 3, wherein the diffusion layer includes third polysilicon containing first conductivity type impurities, which is disposed in the diffusion layer, and implanted into the diffusion layer to a depth equivalent to a depth of the second polysilicon.

5. The semiconductor device according to claim 3, wherein:
the vertical semiconductor element includes a body layer formed on an upper surface portion of the low-concentration layer and containing second conductivity type impurities, a source layer formed on the body layer and containing first conductivity type impurities, and a third electrode formed on the low-concentration layer,
the source layer is electrically connected with the second electrode,
the second polysilicon is electrically connected with the third electrode, and
the first, second and third electrodes operate as a drain, source, and gate electrodes respectively of a field-effect transistor.

6. The semiconductor device according to claim 5, wherein
the second polysilicon includes fifth polysilicon, an insulation layer formed on the fifth polysilicon, and fourth polysilicon formed above the insulation layer,
the fifth polysilicon is connected with the second electrode, and
the fourth polysilicon is connected with the third electrode.

7. The semiconductor device according to claim 2, wherein
the vertical semiconductor element includes a base layer formed on an upper surface portion of the low-concentration layer and containing second conductivity type impurities, an emitter layer formed on the base layer and containing first conductivity type impurities, and a third electrode formed on the low-concentration layer,
the emitter layer is electrically connected with the second electrode,
the base layer is electrically connected with the third electrode, and
the first, second and third electrodes operate as a collector, emitter, and base electrodes respectively of a bipolar transistor.

8. The semiconductor device according to claim 3, wherein
the vertical semiconductor element includes a base layer formed on an upper surface portion of the low-concentration layer and containing second conductivity type impurities, an emitter layer formed on the base layer and containing first conductivity type impurities, and a third electrode formed on the low-concentration layer,
the second polysilicon is implanted into the emitter layer, and electrically connected with the second electrode,
the base layer is electrically connected with the third electrode, and
the first, second and third electrodes operate as a collector, emitter, and base electrodes respectively of a bipolar transistor.

9. The semiconductor device according to claim 2, wherein:
the vertical semiconductor element includes an anode layer electrically connected with the second electrode, formed on an upper surface portion of the low-concentration layer, and containing second conductivity type impurities, and
the first and second electrodes operate as a cathode and anode electrodes respectively of a junction diode.

10. The semiconductor device according to claim 2, wherein
the vertical semiconductor element includes a metal layer electrically connected with the second electrode, and formed on the low-concentration layer, and
the first and second electrodes operate as a cathode and anode electrodes respectively of a Schottky barrier diode.

11. The semiconductor device according to claim 3, wherein
the vertical semiconductor element includes a metal layer electrically connected with the second electrode, and formed on the low-concentration layer,
the second polysilicon is formed on an upper surface portion of the low-concentration layer while insulated from the low-concentration layer, and electrically connected with the second electrode, and
the first and second electrodes operate as a cathode and anode electrodes respectively of a Schottky barrier diode.

12. The semiconductor device according to claim 4, wherein:
the vertical semiconductor element includes a body layer formed on an upper surface portion of the low-concentration layer and containing second conductivity type impurities, a source layer formed on the body layer and containing first conductivity type impurities, and a third electrode formed on the low-concentration layer,
the source layer is electrically connected with the second electrode,
the second polysilicon is electrically connected with the third electrode, and
the first, second and third electrodes operate as a drain, source, and gate electrodes respectively of a field-effect transistor.

13. The semiconductor device according to claim 12, wherein
the second polysilicon includes fifth polysilicon, an insulation layer formed on the fifth polysilicon, and fourth polysilicon formed above the insulation layer,
the fifth polysilicon is connected with the second electrode, and
the fourth polysilicon is connected with the third electrode.

14. The semiconductor device according to claim 4, wherein
the vertical semiconductor element includes a base layer formed on an upper surface portion of the low-concentration layer and containing second conductivity type impurities, an emitter layer formed on the base layer and containing first conductivity type impurities, and a third electrode formed on the low-concentration layer, the second polysilicon is implanted into the emitter layer, and electrically connected with the second electrode, the base layer is electrically connected with the third electrode, and the first, second and third electrodes operate as a collector, emitter, and base electrodes respectively of a bipolar transistor.

15. The semiconductor device according to claim 4, wherein the vertical semiconductor element includes a metal layer electrically connected with the second electrode, and formed on the low-concentration layer, the second polysilicon is formed on an upper surface portion of the low-concentration layer while insulated from the low-concentration layer, and electrically connected with the second electrode, and the first and second electrodes operate as a cathode and anode electrodes respectively of a Schottky barrier diode.

\* \* \* \* \*